United States Patent [19]
Chiyonobu et al.

[11] Patent Number: 5,417,362
[45] Date of Patent: May 23, 1995

[54] ELECTRICAL CONNECTING METHOD

[75] Inventors: Tatsuo Chiyonobu; Kaoru Hashimoto, both of Kawasaki, Japan

[73] Assignee: Fujitsu Limited, Kawasaki, Japan

[21] Appl. No.: 205,766

[22] Filed: Mar. 4, 1994

Related U.S. Application Data

[63] Continuation of Ser. No. 96,833, Jul. 26, 1993, abandoned, which is a continuation of Ser. No. 942,807, Sep. 10, 1992, abandoned.

[30] Foreign Application Priority Data

Sep. 10, 1991 [JP]  Japan ................. 3-229269
May 19, 1992 [JP]  Japan ................. 4-126406

[51] Int. Cl.[6] .............. B23K 31/02; B23K 35/26
[52] U.S. Cl. ................. 228/180.1; 228/214; 228/254; 428/642
[58] Field of Search .......... 428/642; 228/180.21, 228/214, 254, 180.1

[56] References Cited

U.S. PATENT DOCUMENTS

| | | | |
|---|---|---|---|
| 3,337,309 | 8/1967 | Lewis et al. | 428/642 |
| 4,238,528 | 12/1980 | Angelo et al. | 228/214 |
| 4,615,479 | 10/1986 | Ohotushi et al. | 228/214 |
| 4,966,142 | 10/1990 | Zimmerman et al. | 228/263.12 |
| 5,007,163 | 4/1991 | Pope et al. | 228/180.2 |
| 5,017,738 | 5/1991 | Tsuji et al. | 174/94 R |

FOREIGN PATENT DOCUMENTS

| | | |
|---|---|---|
| 57-123673 | 8/1982 | Japan . |
| 58-130540 | 8/1983 | Japan . |
| 2260384 | 10/1990 | Japan . |

OTHER PUBLICATIONS

07/374,411 Jun. 30, 1989 Zimmerman 4,966,142.
European Search Report, The Hague, search completed Aug. 27, 1993.

*Primary Examiner*—P. Austin Bradley
*Assistant Examiner*—Jeffrey T. Knapp
*Attorney, Agent, or Firm*—Staas & Halsey

[57] ABSTRACT

An electrical connecting method connects a first contact of a first object to a second contact of a second object. The electrical connecting method includes the steps of coating a Ga system liquid metal on at least one of the first and second contacts, where the Ga system liquid metal includes a predetermined weight percent of Bi, and contacting the first contact to the second contact via the Ga system liquid metal. The predetermined weight percent of Bi is selected such that the liquid state of the Ga system liquid metal is maintained when the first and second contacts make contact via the Ga system liquid metal.

19 Claims, 10 Drawing Sheets

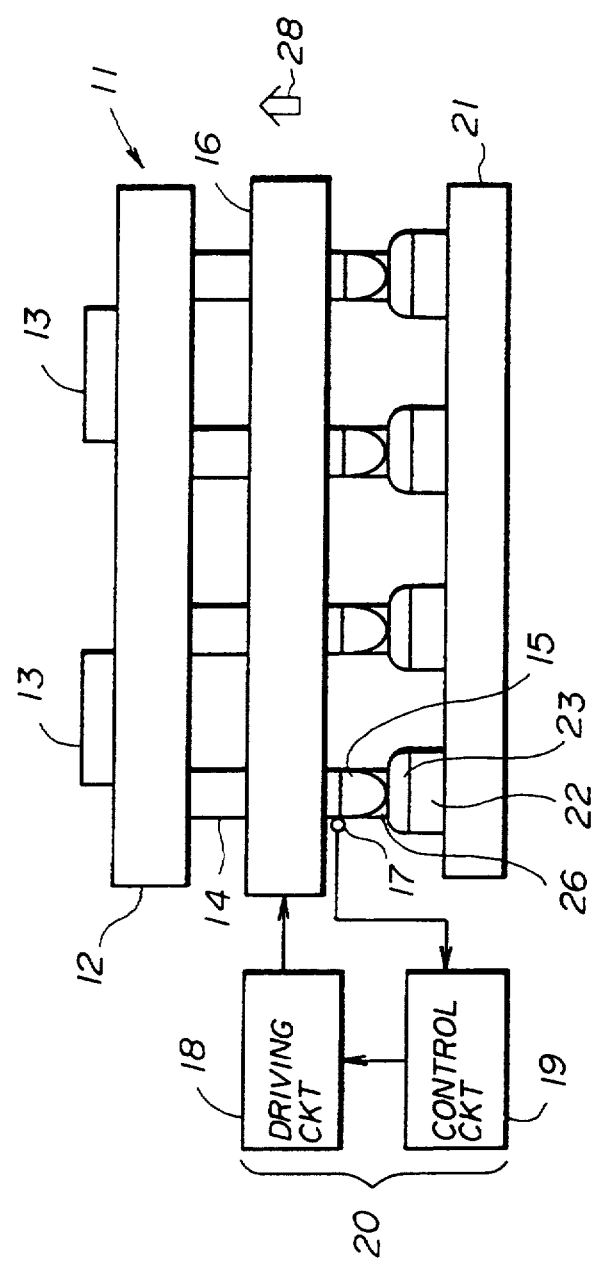

ELECTRICAL CONNECTING METHOD

This is a continuation of U.S. Pat. application Ser. No. 08/096,833, filed Jul. 26, 1993, now abandoned, which is a continuation of application Ser. No. 07/942,807, filed Sep. 10, 1992, now abandoned.

BACKGROUND OF THE INVENTION

The present invention generally relates to electrical connecting methods, and more particularly to an electrical connecting method which makes an electrical connection using a gallium (Ga) system liquid metal. Note that, as per convention, a Ga system identifies a system that has Ga as its primary component.

Recently, the number of terminals has increased and the pitch of the terminals has become narrower due to the reduced size of electronic devices and the high packaging density. For this reason, how to detachably connect a large number of terminals extending from a large scale semiconductor integrated circuit device, a printed circuit and the like is becoming an important problem to be solved.

Conventionally, connectors are used to detachable connect the terminals. The connector has various shapes and configurations depending on the object and use of the connection. But basically, the connector is made up of a plurality of plugs and a plurality of receptacles. Each plug is inserted into the corresponding receptacle and is held thereby to make the electrical connection.

In the normal connector, the connection and disconnection can be made manually if the number of terminals to be connected is on the order of approximately 100. If the inserting force required per terminal is 100 gf, for example, it requires an inserting force of 10 kgf to connect 100 terminals.

But in the printed circuit having a large number of large scale semiconductor integrated circuit devices mounted thereon, the number of terminals to be connected is on the order of several hundred to several thousand. In this case, the connector cannot be connected and disconnected manually. For this reason, methods such as the so-called low inserting force (LIF) method or the zero inserting force (ZIF) method is employed to facilitate the connection and disconnection of the connector. According to such methods, the contact part of the receptacle opens to facilitate insertion and extraction of the corresponding plug. However, the mechanism required to carry out such methods is complex and is unsuited for application to small electronic devices.

On the other hand, methods using a liquid metal have been proposed to make the electrical connection. For example, a metal which is liquid under room temperature is used for the receptacle, and the plug is inserted into the liquid metal receptacle or, at least one of the two contacts to be connected is coated with a liquid metal before the two contacts are connected. However, the methods using the liquid metal have yet to solve the problems which will be described hereunder.

The most familiar metal which is liquid under room temperature is probably mercury (Hg). For example, a method using Hg in a contact part of the connector is proposed in a Japanese Laid-Open Patent Application No.57-123673. Hg may not have been used for the connector, but it was well known to use Hg for a small number of terminals of experimental devices. However, although Hg is toxic, it is difficult to use Hg in a perfectly sealed environment and the use of Hg in the connector having a large number of terminals is impractical for safety reasons.

On the other hand, it is conceivable to use an eutectic alloy of Ga such as gallium-indium (Ga—In) and gallium-tin (Ga—Sn) which has an extremely low melting point and is liquid under room temperature. The use of Ga—In is proposed in a Japanese Laid-Open Patent Application No. 58-130540, for example. It is convenient to use such an eutectic alloy of Ga for the electrical connection because the melting point of the eutectic alloy can be varied depending on the composition. For example, it is possible to set the melting point of the eutectic alloy so that the temperature rises and the eutectic alloy is melted during operation of the device, and the eutectic alloy is solid while the device is stopped so as to facilitate moving of the device.

Therefore, the use of the eutectic alloy of Ga in the connector is advantageous in that the connection and disconnection can be made without the need of large inserting and extracting forces. However, the easy corrosion of this eutectic alloy makes it difficult to apply the connecting method to an open system.

SUMMARY OF THE INVENTION

Accordingly, it is a general object of the present invention to provide a novel and useful electrical connecting method in which the problem described above is eliminated.

Another and more specific object of the present invention is to provide an electrical connecting method for connecting a first contact of a first object to a second contact of a second object, comprising the steps of (a) coating a Ga system liquid metal on at least one of the first and second contacts, where the Ga system liquid metal includes a predetermined weight percent of Bi, and (b) contacting the first contact to the second contact via the Ga system liquid metal, where the predetermined weight percent of Bi is selected such that the liquid state of the Ga system liquid metal is maintained when the first and second contacts make contact via the Ga system liquid metal. According to the electrical connecting method of the present invention, it is possible to prevent corrosion of the Ga system liquid metal.

Still another object of the present invention is to provide the electrical connecting method described above which further comprises the step of (c) coating a liquid polymer material on a surface of the Ga system liquid metal prior to the step (b). According to the electrical connecting method of the present invention, it is possible to further improve the corrosion resistance of the Ga system liquid metal.

A further object of the present invention is to provide an electrical connecting method for connecting a first contact of a first object to a second contact of a second object, comprising the steps of (a) coating a first material having a weight X on the first contact and coating a second material having a weight Y on the second contact, and (b) contacting the first contact to the second contact via a Ga system liquid metal which is generated by the first and second materials, where the first material includes Ga, the second material includes a material which is selected from a group consisting of In and Sn, and at least one of the first and second materials also includes Bi having a weight Z so that $Z/(X+Y+Z)$ is 0.005 to 0.01. According to the electrical connecting method of the present invention, it is possible to prevent corrosion of the Ga system liquid metal.

Another object of the present invention is to provide any of the electrical connecting methods described above, which further comprises the step of (c) cooling a contact part where the first contact makes contact with the second contact so that a temperature at the contact part is maintained to the room temperature. According to the electrical connecting method of the present invention, it is possible to prevent diffusion of the Ga system liquid metal and greatly extend the reliability of the electrical connection.

Other objects and further features of the present invention will be apparent from the following detailed description when read in conjunction with the accompanying drawings.

BRIEF DESCRIPTION OF THE DRAWINGS

FIG. 4 is a side view for explaining a fourth embodiment of the electrical connecting method according to the present invention;

DESCRIPTION OF THE PREFERRED EMBODIMENTS

Figure 1:
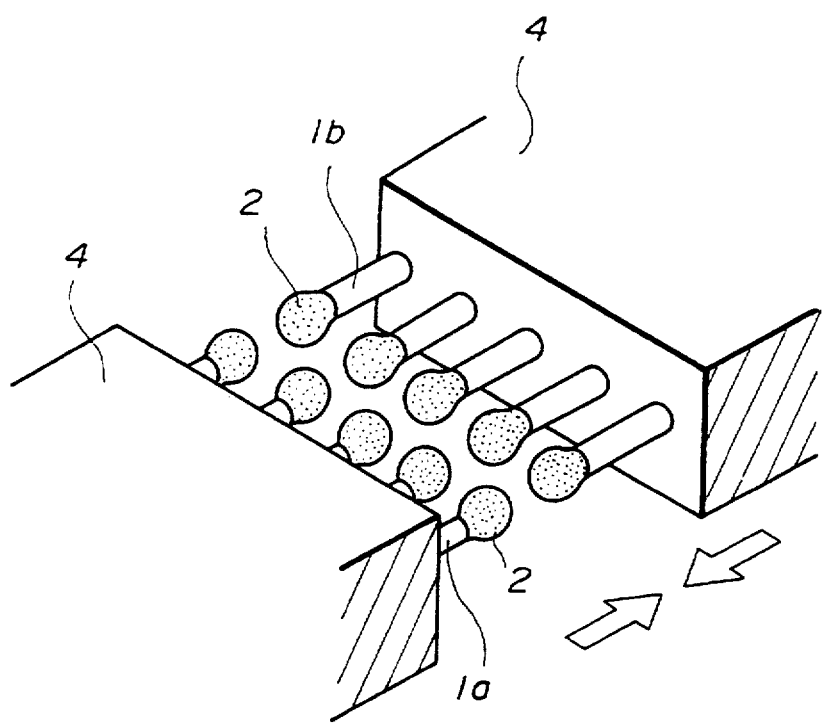
FIG. 1 is a perspective view for explaining a first embodiment of an electrical connecting method according to the present invention.
Figure 2:
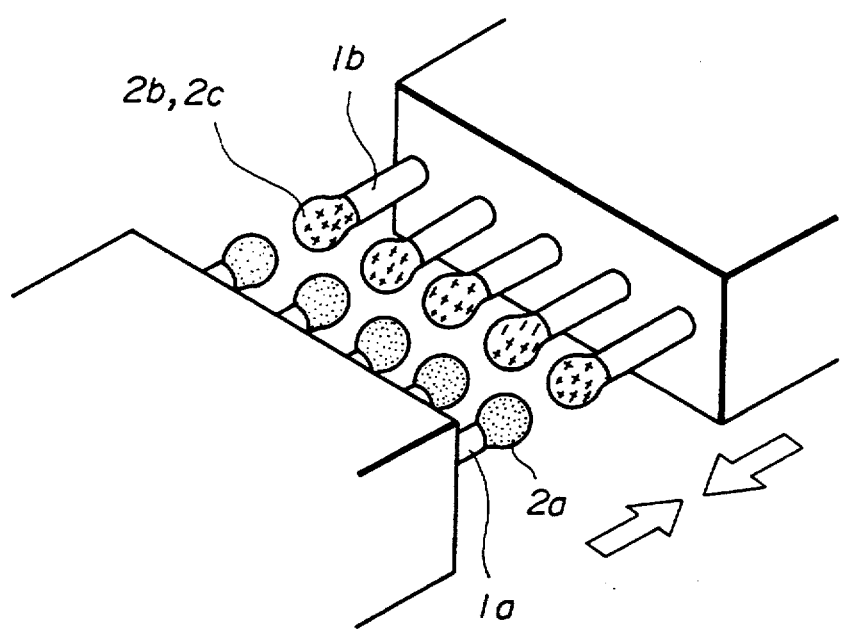
FIG. 2 is a perspective view for explaining a second embodiment of the electrical connecting method according to the present invention.
Figure 3A:
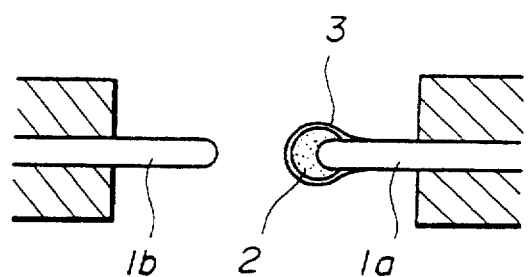
FIG. 3 (A-B) Is a cross sectional view for explaining a third embodiment of the electrical connecting method according to the present invention.
Figure 3B:
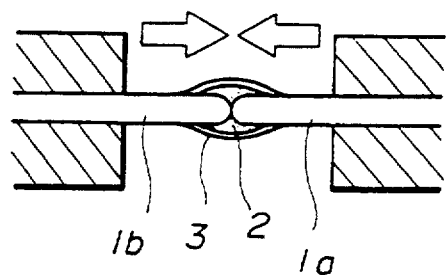

FIGS. 1 and 2 respectively are perspective views for explaining first and second embodiments of an electrical connecting method according to the present invention, and FIG. 3 is a cross sectional view for explaining a third embodiment of the electrical connecting method according to the present invention. In FIGS. 1 through 3, those parts which are the same are designated by the same reference numerals.

In FIGS. 1 through 3, electrical contacts $1a$ extend from one insulator body 4, and electrical contacts $1b$ extend from another insulator body 4. For example, a kovar wire rod having a diameter of 0.5 mm and is made of a Fe—Ni—Co system alloy is used for each of the contacts $1a$ and $1b$, and a Rh or Au plating of 3 $\mu$m is provided in advance on this wire rod. For example, each insulator body 4 is made of polybuthylene terephthalate (PBT), and 360 contacts are embedded at 1 mm intervals and used as a sample for evaluation.

First, a description will be given of the first embodiment, by referring to FIG. 1. In FIG. 1, a Ga system liquid metal 2 such as Ga—In and Ga—Sn includes 0.5 to 1.0 weight percent of Bi. For example, the Bi can be added to the Ga system liquid metal 2 by dissolving small quantities of Bi while heating the Ga system liquid metal 2 to 200° C. The excess Bi separates when the Ga system liquid metal 2 is cooled to room temperature, and the Bi content in the Ga system liquid metal 2 becomes 0.5 to 1.0 weight percent.

The tip ends of the contacts $1a$ and $1b$ are submerged into the Ga system liquid metal 2 which includes Bi, so as to form a ball of the Ga system liquid metal 2 on the tip end of each of the contacts $1a$ and $1b$. For example, the weight of the Ga system liquid metal 2 deposited on the tip end of each of the contacts $1a$ and $1b$ is approximately 5 mg.

When the contacts $1a$ having the balls of the Ga system liquid metal 2 and the contacts $1b$ having the balls of the Ga system liquid metal 2 make contact, each pair of corresponding balls of the Ga system liquid metal 2 on the corresponding pair of contacts $1a$ and $1b$ unite and form one integral ball of the Ga system liquid metal 2. If it is assumed that the load corresponding to the inserting force of a normal connector is approximately 5 gf per contact in order to obtain a safe conduction, the electrical resistance between the pair of contacts $1a$ and $1b$ corresponding to the contact resistance of the normal connector is approximately 10 m$\Omega$.

Accordingly, even when connecting 360 contacts $1a$ to 360 contacts $1b$, a load of approximately 2 kgf is sufficient to realize the connection. In the case of the normal connector, it would require an inserting force of approximately 50 kgf, and thus, this embodiment enables the electrical connection by a load which is approximately several tens of the inserting force required in the case of the normal connector. In addition, the load required to disconnect the pair of contacts $1a$ and $1b$, corresponding to the extracting force required to extract the normal connector, is unnecessary in this embodiment.

The corrosion resistance of the Ga system liquid metal 2 including Bi was tested under a high-temperature and high-humidity environment. The contacts $1a$ and $1b$ which are connected by the integrated balls of the Ga system liquid metal 2 were left in a high-temperature and high humidity environment of 60° C. and 85%RH, and the electrical resistance between the connected pair of contacts $1a$ and $1b$ was measured. No change in the electrical resistance of approximately 10 m$\Omega$ was detected even after 1000 hours.

On the other hand, in the case where the Ga system liquid metal including no Bi is used to connect the corresponding pair of contacts and left in under the above high-temperature and high-humidity environment, it was found that the electrical resistance between the corresponding pair of contacts increased from approximately 10 m$\Omega$ to approximately 1$\Omega$ after 100 hours.

Next, a description will be given of the second embodiment, by referring to FIG. 2. In this embodiment, a first material $2a$ is coated on each tip end of the contact $1a$, while a second material $2b$ is coated on each tip end of the contact $1b$. In this embodiment, the first material $2a$ is Ga having a weight X, and the second material $2b$ is In or Sn having a weight Y. In addition, Bi having a weight Z is included in at least one of the first and second materials $2a$ and $2b$ so that $Z/(X+Y+Z)$ is 0.005 to 0.01.

An eutectic reaction occurs when the first and second materials 2a and 2b on the respective contacts 1a and 1b make contact. As a result, a Ga system liquid metal 2 is generated between each corresponding pair of contacts 1a and 1b, and the corresponding pair of contacts 1a and 1b are electrically connected.

Because the Ga system liquid metal 2 which connects the corresponding pair of contacts 1a and 1b includes 0.5 to 1.0 weight percent of Bi, a corrosion resistance which is substantially the same obtained in the first embodiment was obtained in this embodiment. This was confirmed by an evaluation experiment similar to that described with reference to the first embodiment.

Next, a description will be given of the third embodiment, by referring to FIG. 3. In this embodiment, the Ga system liquid metal 2 is coated on the tip ends of at least one of the contacts 1a and the contacts 1b, and a liquid polymer material 3 is coated on the surface of the Ga system liquid metal 2 as shown in FIG. 3 (A). In this embodiment, the Ga system liquid metal 2 is coated on the tip ends of only the contacts 1a, and the liquid polymer material 3 is coated on the Ga system liquid metal 2 by submerging the tip ends of the contacts 1a in the liquid polymer material 3.

For example, the liquid polymer material 3 is a liquid organic polymer material such as polyphenyl ether and polyperfluoroalkylether. The liquid polymer material 3 acts as a so-called rust preventive agent covering the Ga system liquid metal 2.

When the contact 1a having the Ga system liquid metal 2 coated with the liquid polymer material 3 at the tip end thereof connects to the corresponding contact 1b, the film of the liquid polymer material 3 is pushed away by the contact 1b and the contact 1b makes contact with the contact 1a as shown in FIG. 3 (B). As a result, the contacts 1a and 1b are electrically connected by the Ga system liquid metal 2, and in this state, the liquid polymer material 3 covers the Ga system liquid metal 2.

The weight reduction rate of the liquid polymer material 3 used in this embodiment is approximately 10% at the maximum when heated at 100° C. for 1000 hours. In other words, the evaporation of the liquid polymer material 3 under room temperature is negligible in this embodiment.

The Ga system liquid metal 2 is a liquid under the melting point, and the viscosity thereof is several cP at the maximum. On the other hand, the viscosity of the liquid polymer material 3 is several tens to several hundred cP at room temperature. Hence, the viscosity of the Ga system liquid metal 2 is lower than that of the liquid polymer material 3. For this reason, it may be difficult to coat the liquid polymer material 3 on the Ga system liquid metal 2 which is formed at the tip ends of at least one of the contacts 1a and the contacts 1b.

In such a case, the Ga system liquid metal 2 is subject to the atmosphere and stirred before being coated on the tip ends of the contacts. As a result, an oxide of Ga is generated within the Ga system liquid metal 2, and the viscosity of the Ga system liquid metal 2 gradually increases.

It was confirmed that the viscosity of the Ga system liquid metal 2 increases to approximately 500 cP if stirred in the atmosphere at room temperature for approximately 1 hour. This increased viscosity of the Ga system liquid metal 2 is approximately the same as the viscosity of the polyperfluoroalkylether which is 550 cP. In other words, by stirring the Ga system liquid metal 2 in the atmosphere, it is possible to increase the viscosity of the Ga system liquid metal 2 to a value approximately the same as the viscosity of the liquid polymer material 3 which covers the Ga system liquid metal 2.

Therefore, by increasing the viscosity of the Ga system liquid metal 2 to a value approximately the same as the viscosity of the liquid polymer material 3 before coating the Ga system liquid metal 2 on the tip ends of at least one of the contacts 1a and the contacts 1b, it is possible to satisfactorily coat and cover the Ga system liquid metal 2 on the Ga system liquid metal 2 by simply submerging the tip ends of the contacts coated with the Ga system liquid metal 2.

By covering the Ga system liquid metal 2 with the liquid polymer material 3, it is possible to seal the Ga system liquid metal 2 from the surrounding environment and improve the corrosion resistance characteristic of the Ga system liquid metal 2.

Of course, the Ga system liquid metal 2 may be coated on only one of the contacts 1a and 1b or on both the contacts 1a and 1b, and the same effects are obtained in either case. In addition, if the Ga system liquid metal 2 includes Bi, the corrosion characteristic of the Ga system liquid metal 2 is sufficient, but the corrosion resistance can further be improved by coating the liquid polymer material 3.

In the embodiments described above, the contacts 1a and 1b are made of the kovar wire rod having the diameter of 0.5 mm. However, the tip ends of the contacts which make contact with each other contribute to the electrical connection. Accordingly, an Au bump which is provided as a lead terminal of a semiconductor chip having semiconductor elements, for example, may be used as one of the contacts. In other words, the present invention is applicable to the electrical connection of the semiconductor chips to the package.

Further, the Bi included in the Ga system liquid metal is not limited to 0.5 to 1.0 weight percent. A predetermined weight percent of Bi may be included in the Ga system liquid metal as long as the liquid state of the Ga system liquid metal is maintained when the two corresponding contacts make contact. For example, 10 weight percent of Bi may be included in the Ga system liquid metal.

Certain electronic devices in operation may generate considerable heat. Hence, if the liquid metal is used for the electrical connection in such electronic devices, the liquid metal may diffuse into the contact and eventually disappear with time due to the heat, because the amount of liquid metal coated on the contact is extremely small. If the liquid metal disappears, the contacts are mechanically connected as if the contacts were soldered together. As a result, it becomes extremely difficult to disconnect the electrical connection.

Next, a description will be given of embodiments which can eliminate this problem of decreasing liquid metal due to the heat generated by the electronic device.

Figure 5:
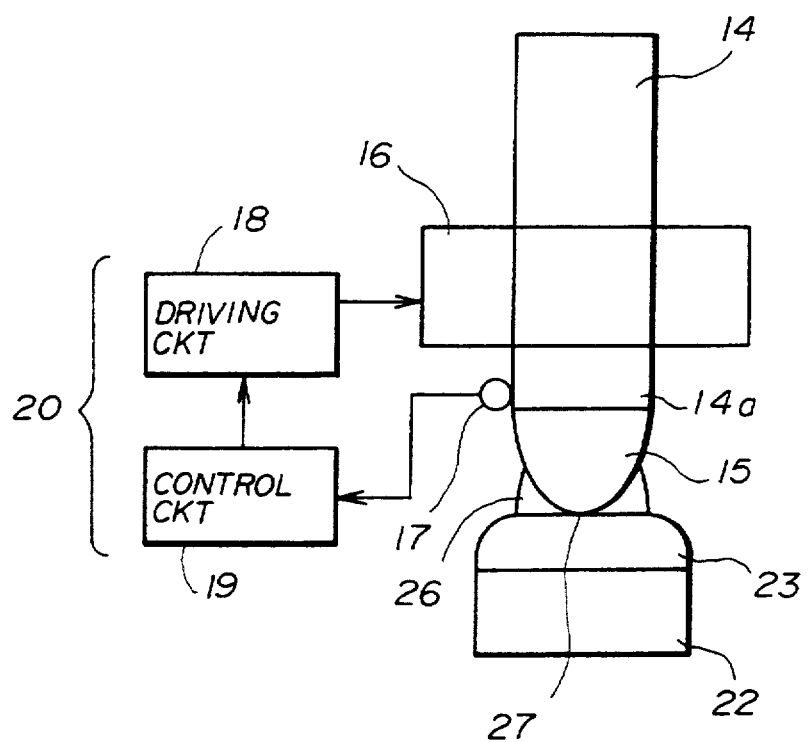
FIG. 5 is a side view of a part of FIG. 4 on an enlarged scale.

First, a description will be given of a fourth embodiment of the electrical connecting method according to the present invention, by referring to FIGS. 4 through 7. FIG. 5 shows a part of FIG. 4 on an enlarged scale.

In FIGS. 4 through 7, an electronic circuit module 11 includes a printed circuit substrate 12, and a plurality of large scale integrated circuits (LSIs) 13 mounted on the printed circuit substrate 12. A plurality of pins 14 which are made of Ni are fixed on the lower surface of the printed circuit substrate 12. A Ga part 15 having a hemispherical shape is provided on a tip end 14a of each pin 14.

A Peltier element 16 is provided at a part to cool all of the pins 14. A thermistor 17 is provided at the tip end 14a of a specific pin 14. A driving circuit 18 is provided to drive the Peltier elements 16. A control circuit 19 monitors the output of the thermistor 17 and controls the operation of the driving circuit 18. The Peltier elements 16, the thermistor 17, the driving circuit 18 and the control circuit 19 form a cooling means 20. This cooling means 20 operates to maintain the tip ends 14a of the terminals 14 to room temperature during operation of the electronic circuit module 11.

On the other hand, a plurality of pad shaped terminals 22 made of Ni are formed on a mother board 21. An In part 23 having a hemispherical shape is provided on top of each pad shaped terminal 22.

Next, a description will be given of the electrical connection of the pins 14 and the corresponding pad shaped terminals 22.

Figure 6:
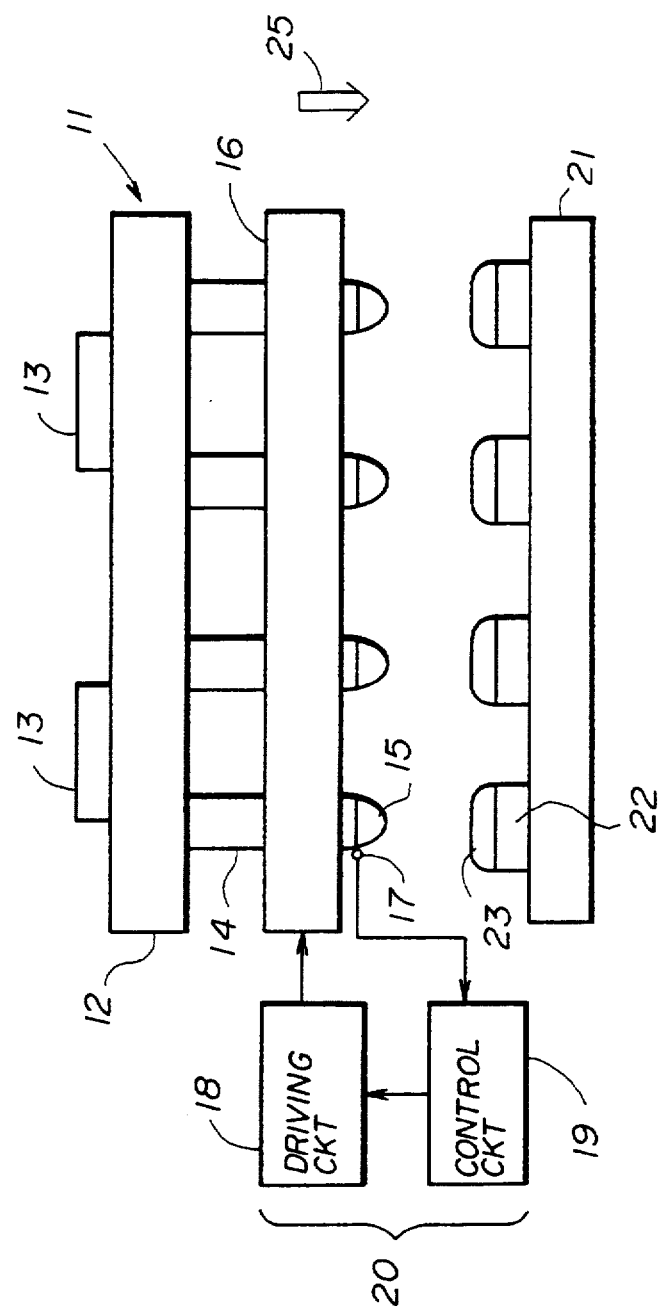
FIG. 6 is a side view for explaining a state immediately before making an electrical connection.

As shown in FIG. 6, the electronic circuit module 11 is first aligned with respect to the mother board 21. Then, as indicated by an arrow 25, the electronic circuit module 11 is lowered so that the pins 14 simply make contact with the corresponding pad shaped terminals 22. Hence, even if the number of pins 14 is large several thousand and large, for example, it is possible to realize the electrical connection using a low load. As a result, the electrical connection is made as shown in FIGS. 4 and 5.

When the Ga part 15 makes contact with the In part 23, an eutectic reaction occurs. For this reason, a liquid phase Ga—In alloy 26 is generated and covers the periphery of a contact part 27 where the Ga part 15 and the In part 23 make contact. Accordingly, the liquid phase Ga—In alloy 26 exists between the pin 14 and the corresponding pad shaped terminal 22, and the area of the contact part 27 is increased thereby. Thus, the contact resistance between the pin 14 and the pad shaped terminal 22 is approximately 20 mΩ and small. The melting point of the Ga—In alloy 26 is 15.7° C.

Next, a description will be given of the state of the electronic circuit module 11 during operation.

When the electronic circuit module 11 operates, the LSIs 13 generate heat and the temperature of the electronic circuit module 11 rises even to 80° C. Consequently, the temperature at the tip end 14a of each terminal 14 increases.

The temperature at the tip end 14a of the terminal 14 is detected by the thermistor 17. When the temperature detected by the thermistor 17 increases, the Peltier elements 16 are operated via the control circuit 19 and the driving circuit 18 in response to the output of the thermistor 17.

When the Peltier elements 16 operate, the pins 14 are cooled. As a result, the contact part 27 and its periphery are cooled via the pins 14, and the temperature is maintained to room temperature which is slightly higher than 15.7° C. For this reason, the diffusion of the liquid phase Ga—In alloy 26 into the Ga part 15 and the In part 23 is suppressed, and the Ga—In alloy 16 maintains the liquid phase and continues to exist between the Ga part 15 and the In part 23. Therefore, the contact resistance between the pin 14 and the pad shaped terminal 22 is maintained to a small value of 20 mΩ.

The present inventors have confirmed that the liquid phase Ga—In alloy 26 remains by cooling the pins 14 by the Peltier elements 16 even after the electronic circuit module 11 and the mother board 21 are left in an environment of 80° C. for 1000 hours.

Next, a description will be given of the operation of removing the electronic circuit module 11 so as to replace the electronic circuit module 11.

Figure 7:
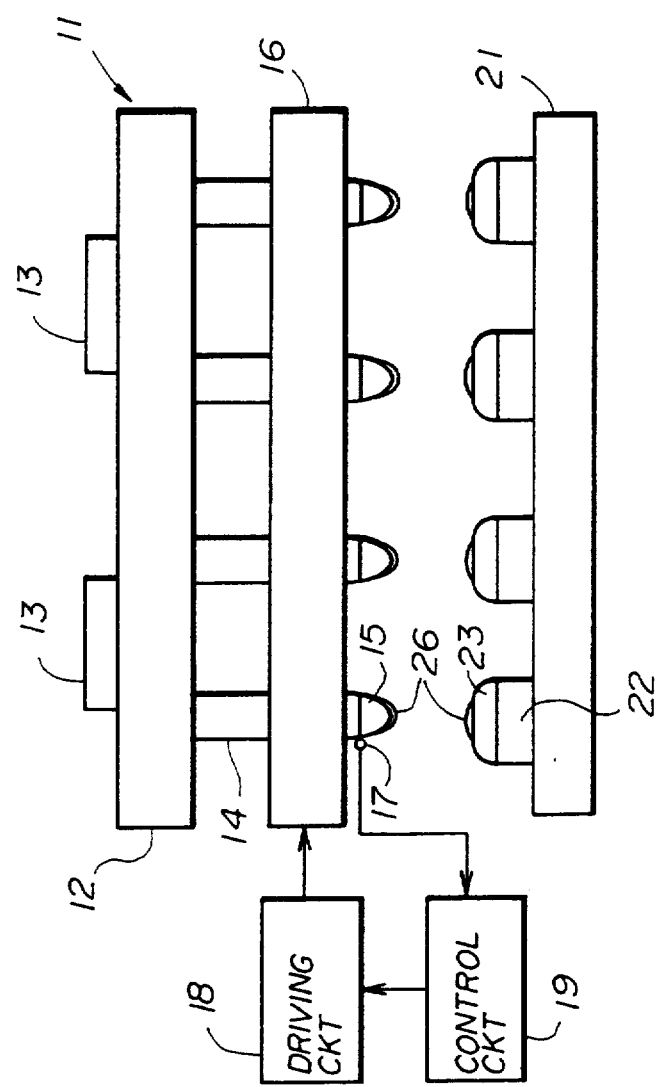
FIG. 7 is a side view for explaining an electrical disconnection.

The electronic circuit module 11 is removed by pulling the electronic circuit module 11 in a direction of an arrow 28 in FIG. 4. When removing the electronic circuit module 11, the liquid phase Ga—In alloy 26 exists in the periphery of the contact part 27, and there is no mechanical connection between the Ga part 15 and the In part 23. In other words, the Ga part 15 and the In part 23 simply make contact with each other. For this reason, no large force is required to separate the pins 14 from the pad shaped terminals 22, and the electronic module 11 can easily be removed from the mother board 21 as shown in FIG. 7 using an extremely small load.

If the temperature at the contact part 27 falls under the melting point of the Ga—In alloy 26, the Ga—In alloy 26 will solidify. But if the temperature is returned to room temperature, the Ga—In alloy 26 will return to the liquid phase, and the electrical connection can be disconnected smoothly at the room temperature.

Figure 8:
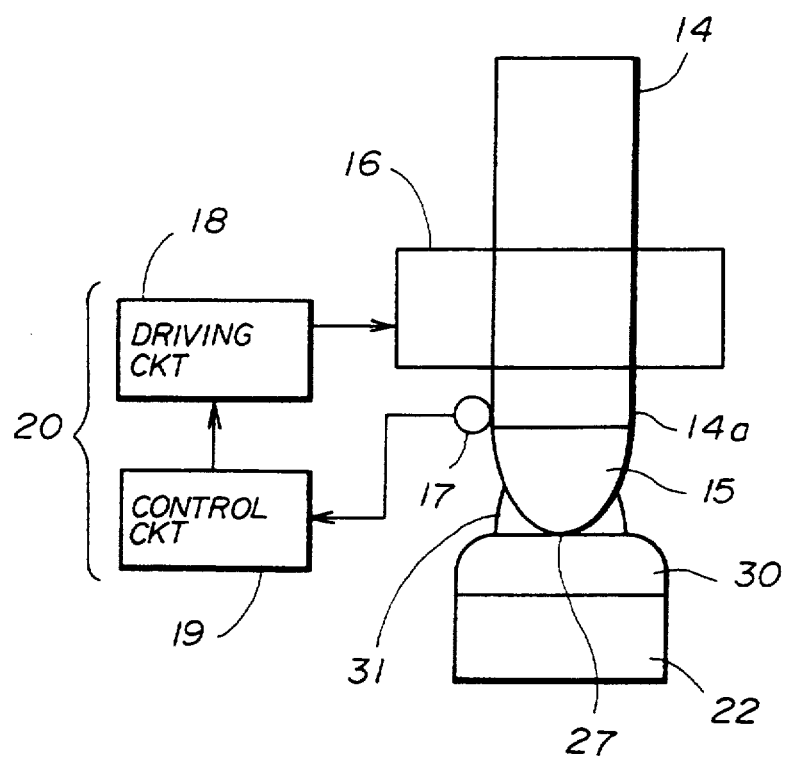
FIG. 8 is a side view for explaining a fifth embodiment of the electrical connecting method according to the present invention.

Next, a description will be given of a fifth embodiment of the electrical connecting method according to the present invention, by referring to FIG. 8. In FIG. 8, those parts which are the same as those corresponding parts in FIGS. 4 through 7 are designated by the same reference numerals, and a description thereof will be omitted.

In this embodiment, a Sn part 30 is provided on the pad shaped terminal 22 in place of the In part 13 of the fourth embodiment. An eutectic reaction occurs when the Ga part 15 makes contact with the Sn part 30, and a liquid phase Ga—Sn alloy 31 exists between the Ga part 15 and the Sn part 30. This Ga—Sn alloy 31 has a melting point of 20° C.

Figure 9:
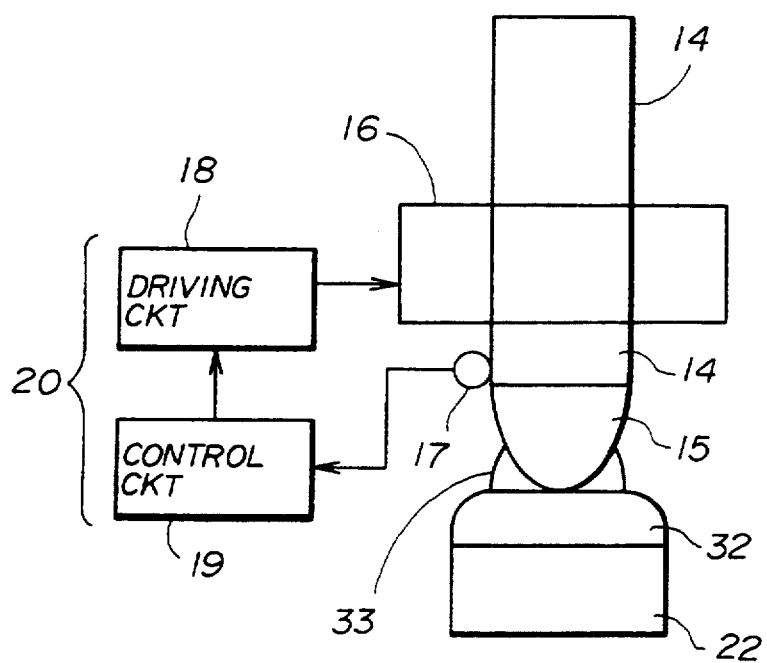
FIG. 9 is a side view for explaining a sixth embodiment of the electrical connecting method according to the present invention.

Next, a description will be given of a sixth embodiment of the electrical connecting method according to the present invention, by referring to FIG. 9. In FIG. 9, those parts which are the same as those corresponding parts in FIGS. 4 through 7 are designated by the same reference numerals, and a description thereof will be omitted.

In this embodiment, a In—Sn part 32 is provided on the pad shaped terminal 22 in place of the In part 13 of the fourth embodiment. An eutectic reaction occurs when the Ga part 15 makes contact with the In—Sn part 30, and a liquid phase Ga—In—Sn alloy 33 exists between the Ga part 15 and the In—Sn part 32. This Ga—In—Sn alloy 33 has a melting point of 15° C.

Figure 10:
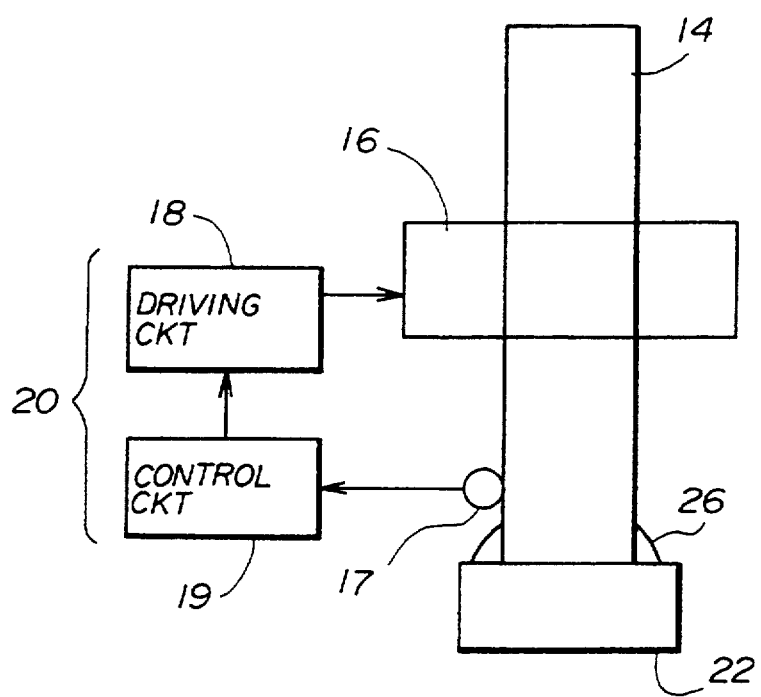
FIG. 10 is a side view for explaining a seventh embodiment of the electrical connecting method according to the present invention.

Next, a description will be given of a seventh embodiment of the electrical connecting method according to the present invention, by referring to FIG. 10. In FIG. 10, those parts which are the same as those corresponding parts in FIGS. 4 through 7 are designated by the same reference numerals, and a description thereof will be omitted.

In this embodiment, the pins 14 are made to contact the corresponding pad shaped terminal 22 at a contact part, and the liquid phase Ga—In alloy 26 is deposited on the contact part. Of course, the liquid phase Ga—Sn alloy 31 or the liquid phase Ga—In—Sn alloy 33 may be used in place of the liquid phase Ga—In alloy 26.

The materials and methods used in the first through third embodiments can of course be applied to the fourth through seventh embodiments described above.

In addition, a cooling unit using cooling water or fluorocarbon coolant may be used in place of the Peltier element 16.

Moreover, the fourth through seventh embodiments can be applied to the general connector using a plug and socket (or receptacle) combination.

Further, the present invention is not limited to these embodiments, but various variations and modifications may be made without departing from the scope of the present invention.

What is claimed is:

1. An electrical connecting method for connecting a first contact of a first object to a second contact of a second object, said electrical connecting method comprising the steps of:
   (a) coating a Ga system liquid metal on at least one of the first and second contacts, said Ga system liquid metal including a predetermined weight percent of Bi;
   (b) contacting the first contact to the second contact via the Ga system liquid metal,
   said predetermined weight percent of Bi being selected such that the liquid state of the Ga system liquid metal is maintained when the first and second contacts make contact via the Ga system liquid metal;
   (c) coating a liquid polymer material on a surface of the Ga system liquid metal prior to said step (b); and
   (d) stirring the Ga system liquid metal in atmosphere so that the viscosity of the Ga system liquid metal becomes approximately the same as the viscosity of the liquid polymer material prior to said step (c).

2. An electrical connecting method for connecting a first contact of a first object to a second contact of a second object, said electrical connecting method comprising the steps of:
   (a) coating a Ga system liquid metal on at least one of the first and second contacts, said Ga system liquid metal including a predetermined weight percent of Bi;
   (b) contacting the first contact to the second contact via the Ga system liquid metal,
   said predetermined weight percent of Bi being selected such that the liquid state of the Ga system liquid metal is maintained when the first and second contacts make contact via the Ga system liquid metal; and
   (c) coating a liquid polymer material on a surface of the Ga system liquid metal prior to said step (b), the liquid polymer material being selected from a group consisting of polyphenyl ether and polyperfluoroalkylether.

3. An electrical connecting method for connecting a first contact of a first object to a second contact of a second object, said electrical connecting method comprising the steps of:
   (a) coating a Ga system liquid metal on at least one of the first and second contacts, said Ga system liquid metal including a predetermined weight percent of Bi, the Ga system liquid metal maintaining a liquid phase at room temperature;
   (b) contacting the first contact to the second contact via the Ga system liquid metal,
   said predetermined weight percent of Bi being selected such that the liquid state of the Ga system liquid metal is maintained when the first and second contacts make contact via the Ga system liquid metal; and
   (c) cooling a contact part where the first contact makes contact with the second contact so that a temperature at the contact part is maintained to the room temperature, the contact part being cooled by monitoring the temperature at the contact part.

4. An electrical connecting method for connecting a first contact of a first object to a second contact of a second object, said electrical connecting method comprising the steps of:
   (a) coating a Ga system liquid metal on at least one of the first and second contacts, said Ga system liquid metal including a predetermined weight percent of Bi, the Ga system liquid metal maintaining a liquid phase at room temperature;
   (b) contacting the first contact to the second contact via the Ga system liquid metal,
   said predetermined weight percent of Bi being selected such that the liquid state of the ga system liquid metal is maintained when the first and second contacts make contact via the Ga system liquid metal; and
   (c) cooling a contact part where the first contact makes contact with the second contact so that a temperature at the contact part is maintained to the room temperature, the contact part being cooled by monitoring the temperature at the first contact.

5. An electrical connecting method for connecting a first contact of a first object to a second contact of a second object, said electrical connecting method comprising the steps of:
   (a) coating a first material having a weight X on the first contact and coating a second material having a weight Y on the second contact;
   (b) contacting the first contact to the second contact via a Ga system liquid metal which is generated by the first and second materials,
   said first material including Ga,
   said second material including a material which is selected from a group consisting of In and Sn,
   at least one of said first and second materials also including Bi having a weight Z so that $Z/(X+Y+Z)$ is 0.005 to 0.01, step (a) using the first and second materials such that the Ga system liquid metal maintains a liquid phase at room temperature; and
   (c) cooling a contact part where the first contact makes contact with the second contact so that a temperature at the contact part is maintained to the room temperature; the contact part being cooled by monitoring the temperature at the contact part.

6. An electrical connecting method for connecting a first contact of a first object to a second contact of a second object, said electrical connecting method comprising the steps of:
   (a) coating a first material having a weight X on the first contact and coating a second material having a weight Y on the second contact;
   (b) contacting the first contact to the second contact via a Ga system liquid metal which is generated by the first and second materials,
   said first material including Ga,
   said second material including a material which is selected from a group consisting of In and Sn, at least one of said first and second materials also including Bi having a weight Z so that $Z/(X+Y+Z)$ is 0.005 to 0.01, step (a) using the first and second materials such that the Ga system liquid metal maintains a liquid phase at room temperature; and (c) cooling a contact part where the first contact makes contact with the second contact so that a temperature at the contact part is maintained to the room temperature; the contact part being cooled by monitoring the temperature at the first contact.

7. An electrical connecting method for connecting a first contact of a first object to a second contact of a second object, said electrical connecting method comprising the steps of:

(a) coating a first material having a weight X on the first contact and coating a second material having a weight Y on the second contact; and (b) contacting the first contact to the second contact via a Ga system liquid metal which is generated by the first and second materials and includes substantially no Hg, said Ga system liquid metal maintaining a liquid phase at room temperature, said first material including Ga as the primary component, said second material including a material which is selected from a group consisting of In and Sn, at least one of said first and second materials also including Bi as an additive, Bi having a weight Z where $Z/(X+Y+Z)$ is in the range of 0.005 to 0.01.

8. The electrical connecting method as claimed in claim 7, which further comprises the step of:

(c) cooling a contact part where the first contact makes contact with the second contact so that the temperature at the contact part is maintained at room temperature.

9. The electrical connecting method as claimed in claim 7, wherein the first contact is formed by each pin extending from an electronic circuit module which forms the first object, and the second contact is formed by each terminal formed on a mother board which forms the second object.

10. The electrical connecting method as claimed in claim 7, wherein the first object has a plurality of first contacts, the second object has a plurality of second contacts, and said steps (a) and (b) are carried out for each pair of corresponding first and second contacts.

11. The electrical connecting method as claimed in claim 7, wherein said step (a) coats the first material on a tip end of the first contact and coats the second material on a tip end of the second contact, and said step (b) contacts the tip end of the first contact to the tip end of the second contact via the Ga system liquid metal.

12. An electrical connecting method for connecting a first contact of a first object to a second contact of a second object, said electrical connecting method comprising the steps of:

(a) coating a Ga system liquid metal which includes substantially no Hg on at least one of the first and second contacts; and (b) contacting the first contact to the second contact via the Ga system liquid metal, a liquid state of the Ga system liquid metal being maintained at room temperature when the first and second contacts make contact via the Ga system liquid metal so that the first and second contacts can be electrically connected and disconnected at room temperature via the Ga system liquid metal, the Ga system liquid metal being obtained by dissolving small quantities of Bi in a liquid metal containing primarily Ga while heating the liquid metal and then cooling the heated liquid metal with Bi dissolved therein to room temperature so that excess Bi separates from the resulting Ga system liquid metal and the Bi content in the Ga system liquid metal is in the range of 0.5 to 1.0 weight percent.

13. The electrical connecting method as claimed in claim 12, wherein said step (a) uses the Ga system liquid metal which is selected from a group of Ga system alloys consisting of Ga—In alloy, Ga—Sn alloy and Ga—In—Sn alloy.

14. The electrical connecting method as claimed in claim 12, which further comprises the step of:

(c) cooling a contact part where the first contact makes contact with the second contact so that the temperature at the contact part is maintained at room temperature.

15. The electrical connecting method as claimed in claim 12, wherein the first contact is formed by each pin extending from an electronic circuit module which forms the first object, and the second contact is formed by each terminal formed on a mother board which forms the second object.

16. The electrical connecting method as claimed in claim 12, wherein the first object has a plurality of first contacts, the second object has a plurality of second contacts, and said steps (a) and (b) are carried out for each pair of corresponding first and second contacts.

17. The electrical connecting method as claimed in claim 12, wherein said step (a) coats the Ga system liquid metal on a tip end of at least one of the first and second contacts, and said step (b) contacts the tip end of the first contact to the tip end of the second contact via the Ga system liquid metal.

18. The electrical connecting method as claimed in claim 12, which further comprises the step of:

(c) coating a liquid polymer material on a surface of the Ga system liquid metal prior to said step (b).

19. The electrical connecting method as claimed in claim 12, wherein the small quantities of Bi are dissolved in the liquid metal while heating the liquid metal to a temperature of approximately 200° C.

* * * * *